United States Patent
Conlon et al.

(10) Patent No.: US 12,224,726 B2
(45) Date of Patent: *Feb. 11, 2025

(54) VOLUME SCALING AND SYNCHRONIZATION OF TONES

(71) Applicant: WHELEN ENGINEERING COMPANY, INC., Chester, CT (US)

(72) Inventors: Brandon Conlon, Bristol, CT (US); David Dornfeld, Killingworth, CT (US); Caleb Garrett, Essex, CT (US)

(73) Assignee: WHELEN ENGINEERING COMPANY, INC., Chester, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/511,804

(22) Filed: Nov. 16, 2023

(65) Prior Publication Data

US 2024/0088857 A1    Mar. 14, 2024

Related U.S. Application Data

(62) Division of application No. 16/815,988, filed on Mar. 11, 2020, now Pat. No. 11,863,146.

(60) Provisional application No. 62/816,958, filed on Mar. 12, 2019.

(51) Int. Cl.
    *H03G 3/32* (2006.01)
    *H04H 20/59* (2008.01)
    *H04R 5/04* (2006.01)
    *H04W 4/90* (2018.01)

(52) U.S. Cl.
    CPC .............. *H03G 3/32* (2013.01); *H04H 20/59* (2013.01); *H04R 5/04* (2013.01); *H04W 4/90* (2018.02); *H04R 2430/01* (2013.01)

(58) Field of Classification Search
    None
    See application file for complete search history.

(56) References Cited

U.S. PATENT DOCUMENTS

| | | | |
|---|---|---|---|
| 10,205,428 B1* | 2/2019 | Paepcke | B60Q 5/006 |
| 2006/0279959 A1* | 12/2006 | Yabashi | B60Q 3/57 362/253 |
| 2008/0163062 A1* | 7/2008 | Lee | G10L 21/00 715/727 |
| 2013/0247094 A1* | 9/2013 | Hardin | H04N 21/2385 725/33 |
| 2015/0063598 A1* | 3/2015 | Shah | H03G 3/3089 381/105 |
| 2017/0328997 A1* | 11/2017 | Silverstein | G01S 7/003 |

(Continued)

*Primary Examiner* — Duc Nguyen
*Assistant Examiner* — Assad Mohammed
(74) *Attorney, Agent, or Firm* — HOGAN LOVELLS US LLP

(57) ABSTRACT

A system, method and storage medium for providing an emergency alert includes reading tone, using one or more processors, information and volume level information corresponding to an emergency sound generator from memory coupled to the one or more processors; and controlling, using the one or more processors, an output sound of the emergency sound generator based on the tone information and volume level information. The tone information includes data of frequency variation over a predetermined period, and the volume level information includes data of volume level variation over the predetermined period.

8 Claims, 13 Drawing Sheets

(56) References Cited

U.S. PATENT DOCUMENTS

2018/0367887 A1\* 12/2018 Vilhelmsen .......... H04R 29/004
2019/0056741 A1\* 2/2019 Zych ..................... B60Q 5/006

\* cited by examiner

300

| Nodes (or Sirens) | Tones | Frequencies | Volumes |
|---|---|---|---|
| SR 1 | Tone 1 | [f1s, f1e] | [v11s, v11e] [v12s, v12e] |
| SR 2 | Tone 2 | [f2s, f2e] | [v21s, v21e] [v22s, v22e] |
| ⋮ | ⋮ | ⋮ | ⋮ |

FIG. 3

VOLUME SCALING AND SYNCHRONIZATION OF TONES

CROSS REFERENCE TO RELATED APPLICATIONS

This application is a divisional of U.S. patent application Ser. No. 16/815,988 filed Mar. 11, 2020 titled VOLUME SCALING AND SYNCHRONIZATION OF TONES, which claims priority to and the benefit of U.S. Provisional Patent Application No. 62/816,958 filed Mar. 12, 2019 titled VOLUME SCALING AND SYNCHRONIZATION OF TONES, the full disclosures of which are hereby incorporated by reference in their entirety for all intents and purposes.

TECHNICAL FIELD

This application relates to a system and method for volume scaling and synchronization of tones of an emergency sound.

BACKGROUND

A major challenge to overcome in the emergency response market is the vastly varying compliances in volume level that have to be met with sirens based on where the siren is being used. Further, one of purposes of sirens is to alert neighboring drivers a presence of an emergency vehicle, so the emergency vehicle can pass the traffic safely. Thus, an emergency sound from sirens is required to be generated not only for scaling its output volume to meet the compliance but also for maximizing the effect of an alert such as informing the presence of the emergency vehicle to as many of people as possible.

SUMMARY OF THE INVENTION

In one aspect, there is provided a system for providing an emergency sound alert. The system includes one or more processors and a memory coupled to the processors. The processors are configured to: read tone information and volume level information corresponding to an emergency sound generator from the memory; and control an output sound of the emergency sound generator based on the tone information and volume level information. The memory stores the tone information including frequency variation data over a predetermined period and the volume level information including volume level variation data over the predetermined period.

In another aspect of the present disclosure, there is provided a method for providing an emergency sound alert. The method includes reading, using one or more processors, tone information and volume level information corresponding to an emergency sound generator from memory coupled to the one or more processors; and controlling, using the one or more processors, an output sound of the emergency sound generator based on the tone information and volume level information. The tone information includes data of frequency variation over a predetermined period, and the volume level information includes data of volume level variation over the predetermined period.

In still another aspect of the present disclosure, there is provided a computer-readable storage medium having computer readable program instructions. The computer readable program instructions can be read and executed by at least one processor for performing a method for providing an emergency sound alert. The method includes reading tone information and volume level information corresponding to an emergency sound generator from a memory; and controlling an output sound of the emergency sound generator based on the tone information and volume level information. The tone information includes data of frequency variation over a predetermined period, and the volume level information includes data of volume level variation over the predetermined period.

In still yet another aspect of the present disclosure, there is provided a synchronization system. The system includes a first node, a second node, and one or more processors. The first node is configured to: read first tone information and first volume level information both corresponding to the first emergency sound generator from at least one memory; and generate a first tone signal having a voltage level based on the first tone information and the first volume level information. The second node is configured to: read second tone information and second volume level information both corresponding to the second emergency sound generator from the at least one memory; and generate a second tone signal having a voltage level based on the second tone information and the second volume level information. The one or more processors are configured to synchronize the first tone signal and the second tone signal. Each of the first tone information and the second tone information includes data of frequency variation over a predetermined period, and each of the first volume level information and the second volume level information includes data of volume level variation over the predetermined period.

In still yet another aspect of the present disclosure, there is provided a synchronization method. The method includes reading, by a first node including a first emergency sound generator, first tone information and first volume level information both corresponding to the first emergency sound generator from at least one memory coupled; and generating, by the first node, a first tone signal having a voltage level based on the first tone information and the first volume level information; reading, by a second node including a second emergency sound generator, second tone information and second volume level information both corresponding to the second emergency sound generator from the at least one memory; generating, by the second node, a second tone signal having a voltage level based on the second tone information and the second volume level information; and synchronizing, by one or more processors, the first tone signal and the second tone signal. Each of the first tone information and the second tone information includes data of frequency variation over a predetermined period, and each of the first volume level information and the second volume level information includes data of volume level variation over the predetermined period.

In still yet another aspect of the present disclosure, there is provided a computer-readable storage medium having computer readable program instructions. The computer readable program instructions can be read and executed by at least one processor for performing a synchronization method. The method includes reading first tone information and first volume level information both corresponding to the first emergency sound generator from at least one memory coupled; and generating a first tone signal having a voltage level based on the first tone information and the first volume level information; reading second tone information and second volume level information both corresponding to the second emergency sound generator from the at least one memory; generating a second tone signal having a voltage level based on the second tone information and the second volume level information; and synchronizing the first tone signal and the second tone signal. Each of the first tone information and the second tone information includes data of frequency variation over a predetermined period, and each of the first volume level information and the second volume level information includes data of volume level variation over the predetermined period.

BRIEF DESCRIPTION OF THE DRAWINGS

The present disclosure will become more readily apparent from the specific description accompanied by the drawings.

FIG. 3 is a view illustrating a mapping table among nodes (or sirens), tones, frequency variation, and volume level variation according to an embodiment of the present disclosure;

DETAILED DESCRIPTION

The present disclosure may be understood more readily by reference to the following detailed description of the disclosure taken in connection with the accompanying drawing figures, which form a part of this disclosure. It is to be understood that this disclosure is not limited to the specific devices, methods, conditions or parameters described and/or shown herein, and that the terminology used herein is for the purpose of describing particular embodiments by way of example only and is not intended to be limiting of the claimed disclosure.

Also, as used in the specification and including the appended claims, the singular forms "a," "an," and "the" include the plural, and reference to a particular numerical value includes at least that particular value, unless the context clearly dictates otherwise. Ranges may be expressed herein as from "about" or "approximately" one particular value and/or to "about" or "approximately" another particular value. When such a range is expressed, another embodiment includes from the one particular value and/or to the other particular value.

The phrases "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

Figure 1:
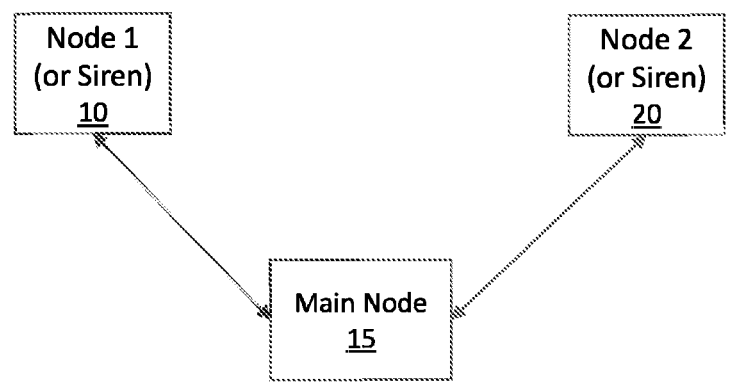
FIG. 1 is a view illustrating a synchronization among nodes associated with sirens and a main node according to an embodiment of the present disclosure.

FIG. 1 is a view illustrating a synchronization among nodes 10 and 20 associated with sirens and a main node 15 according to an embodiment of the present disclosure.

Referring to FIG. 1, the main node 15 may include an internal timer (not shown) used for synchronizing the nodes globally. The main node 15 may be a main box in a vehicle in communication with each node 10 or 20 over e.g., a control area network (CAN) bus network 13.

It is noted that in the present disclosure, a node is associated with a siren. For example, a siren may be located in a node, or in some aspects, the siren is not located in the node, but is controlled by a processing unit (e.g., processor 110 of FIG. 2B) belongs to the node. Still, for example, the siren can be the node itself. For the sake of description, only cases where the siren is located in each node or is the node itself are assumed. However, embodiments of the present disclosure are not limited thereto.

In addition, the nodes (e.g., 10 and 20) may be located in a vehicle or in some aspects, may be located over two or more vehicles. For the sake of description, only a case where the nodes are located in a vehicle. However, embodiments of the present disclosure are not limited thereto.

Each node 10 and 20 is in communication with the main node 15 over e.g., the CAN bus network 13 which allows the main node 15 and the nodes 10 and 20 to communicate with each other in applications without a host computer.

The present disclosure will be described to address three technical issues as follows:

(a) Controlling of a tone and a volume level to a single siren;

(b) Synchronization Between More Than One Sirens—Tone Synchronization; and (c) Asynchronous Mode Tone Synchronization.

Controlling of a Tone and a Volume Level to a Single Siren

In this section, a method or system for controlling a tone and a volume level to a single siren are described.

Figure 2A:
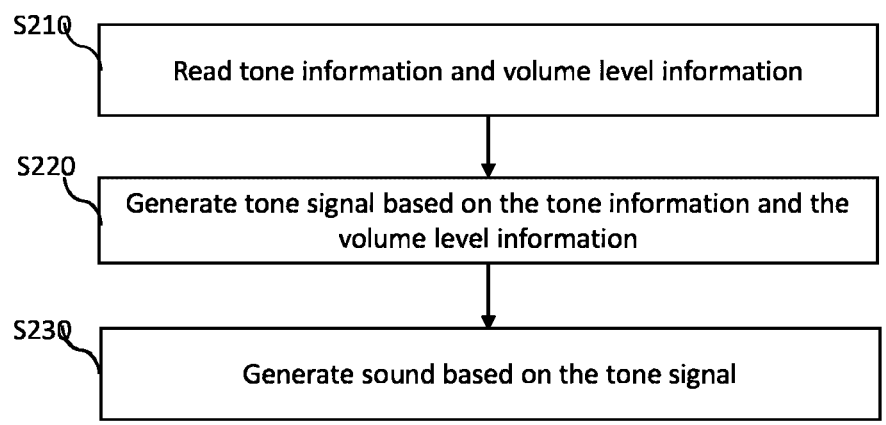
FIG. 2A is a view illustrating a method for an emergency sound output from a node according to an embodiment of the present disclosure.
Figure 2B:
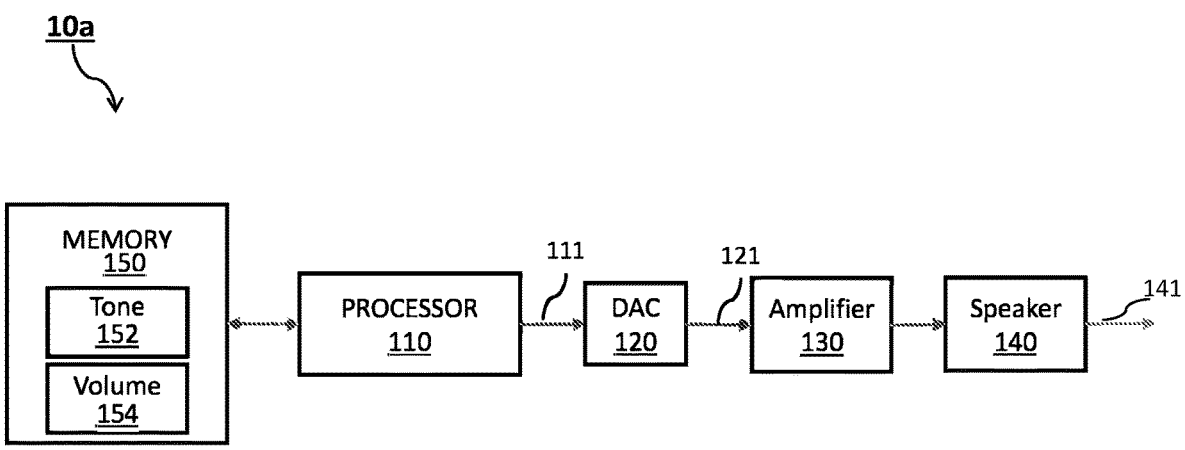
FIG. 2B is a block diagram illustrating an example system associated with the method of FIG. 2A according to an embodiment of the present disclosure.

FIG. 2A is a view illustrating a method for an emergency sound output from a node. FIG. 2B is a block diagram illustrating an example system 10a associated with the method of FIG. 2A.

Referring to FIGS. 2A and 2B, the system 10a includes a processor 110, a memory 150, a digital-to-analog converter (DAC) 120, and a speaker 130. The memory 150 includes tone information 152 and volume level information 154.

In step S210, the processor 150 reads the tone information 152 and the volume level information 152 which a node of the system 10a is based on to generate a sound 141. A tone is defined using one or more frequency lists arranged in a certain time period. Thus, the tone information 152 is associated with frequency variation over a predetermined period (e.g., 1 second). In addition, the volume level information 154 is associated with volume level variation over the same predetermined period. These predetermined periods can be independent of the volume and frequency definitions and can be associated with any tone either defined using a frequency list, or as pulse-code modulation (PCM)/MP3 data which can be made locally on the device at a later time or downloaded to the device at a later time. This allows you to define as to how a tone will ramp up and down in volume without knowing what will play or its period, this association can be figured out on runtime.

Figure 4A:
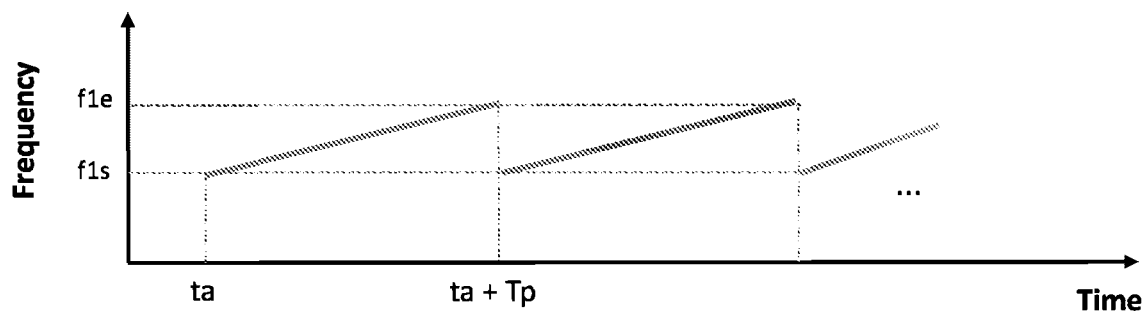
FIG. 4A is a view illustrating frequency variation according to tone information of the mapping table of FIG. 3 according to an embodiment of the present disclosure.

Referring to FIG. 3, a mapping table 300 among nodes (or sirens), tones, frequency variation, and volume level variation. For example, for a certain node SR1, a tone 1 can be preset, and the frequency variation of the tone 1 can be defined as [f1s, f1e], where f1s and f1e represent a start frequency and an end frequency over the predetermined period. Referring further to FIG. 3 illustrating example frequency variation of the tone 1 and volume level variation both associated with the node SR1, the predetermined period starts at a t1 and ends at a t1+Tp, where Tp is a duration of the predetermined period. As shown in FIG. 4A, when the tone 1 is read in regard to the node SR1, the frequency may ramp linearly from f1s to f1e. By way of example only, if the frequency variation is defined as [1 kHz, 2 kHz], the frequency of a sound (or a tone signal) output from the node SR1 linearly increases from 1 kHz to 2 kHz. While one frequency segment is illustrated and described in the present disclosure for the sake of description, embodiments of the present disclosure are not limited thereto. For example, the frequency table may consist of a single frequency segment, or three or more frequency segments, each of which is linearly ramped between, not allowing for jumps in frequency, while the volume table can have due to volumes being defined in pairs consisting of start and end volumes. For example, the end frequency in the previous frequency segment may act as the start frequency of the next frequency segment.

The predetermined period Tp can be divided into a plurality of time points at each of which a corresponding frequency and volume level is read by the processor 110.

Figure 4B:
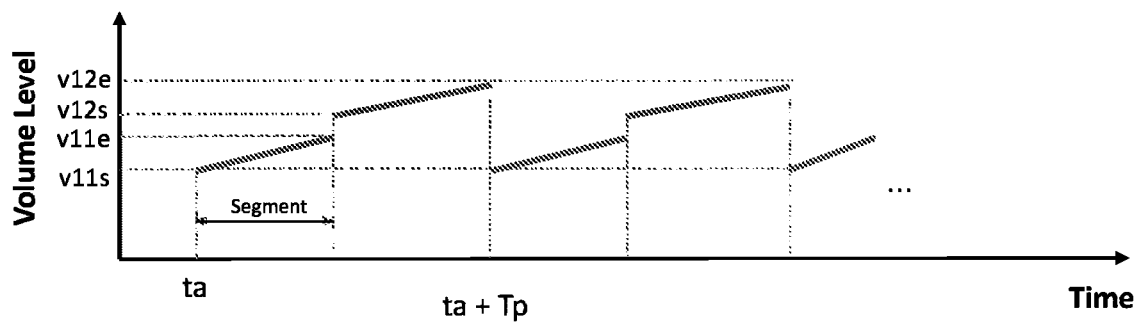
FIG. 4B is a view illustrating volume level variation according to volume level information of the mapping table of FIG. 3 according to an embodiment of the present disclosure.

In addition, referring still to FIGS. 2B, 3 and 4B, the volume level variation can be defined as [v11s, v11e] [v12s, v12e] where each bracket represents a volume segment. While two volume segments are illustrated and described in the present disclosure for the sake of description, embodiments of the present disclosure are not limited thereto. For example, the volume level variation may consist of a single volume segment, or three or more volume segments. Referring further to FIGS. 4A and 4B illustrating an example frequency variation of the tone 1 and volume level variation both associated with the node SR1, the predetermined period starts at a ta and ends at a ta+Tp. For the example volume level variation [v11s, v11e] [v12s, v12e], the volume level will ramp from v11s to v11e in the first half period of Tp and then ramp from v12s to v12e in the second half period.

Similar description can be applied in regard to other nodes including a node SR2. Thus, duplicate of description thereof will be omitted for the sake of simplicity.

As shown in FIG. 3, the volume level variation data can be associated with (or mapped to) any tone whether it is a predefined tone or a yet to be recorded on the fly tone, and the predetermined period Tp over which the volume level variation data are defined will be updated accordingly.

In addition, since segments of the volume level variation data over the predetermined period Tp are defined in pairs, the volume level of a tone signal can vary in a discrete manner without smooth ramping requiring a number of steps to reach a target level, as exemplary shown in FIG. 4B. However, the frequency lists of a tone signal might not be defined in more than one segments and in pairs. For example, if the frequency of a tone signal is defined in a single segment [0, 20 Hz] over the predetermined period Tp, the frequency may linearly ramp from 0 Hz to 20 Hz. This might not allow for instantaneous jumps between frequencies. Thus, to address this issue, multiple tones can be defined to make the instantaneous jumps between frequencies possible. For example, one tone can be defined as [0, 0] over a first predetermined period and another tone can be defined as [10 Hz, 10 Hz] over a second predetermined period following the first predetermined period, so that the frequencies can be placed in sequence with one another to instantly jump from 0 to 10 Hz.

Referring to FIG. 2A, in step S220, the processor 110 generates a tone signal 111 based on the tone information 152 and the volume level information 154. The tone signal 1 has a corresponding frequency and a volume level for each of the plurality of time points of the predetermined period Tp, so that the tone signal 111 will have the frequency variation and the volume level variation as defined in the mapping table 300 of FIG. 3. In addition, the tone signal 111 has a pattern repeated for every predetermined period Tp.

In step S230, the processor 110 generates a sound (wave) based on the tone signal 111. In one embodiment, the tone signal 111 may be a digital signal. The system 10a may further include a DAC 120 which converts the digital tone signal 111 to an analog signal 121. The converted analog signal 121 can be provided to an amplifier 130 and a speaker 140 for generating the emergency sound 141.

Synchronization Between More than One Sirens—Tone Synchronization

Figure 6A:
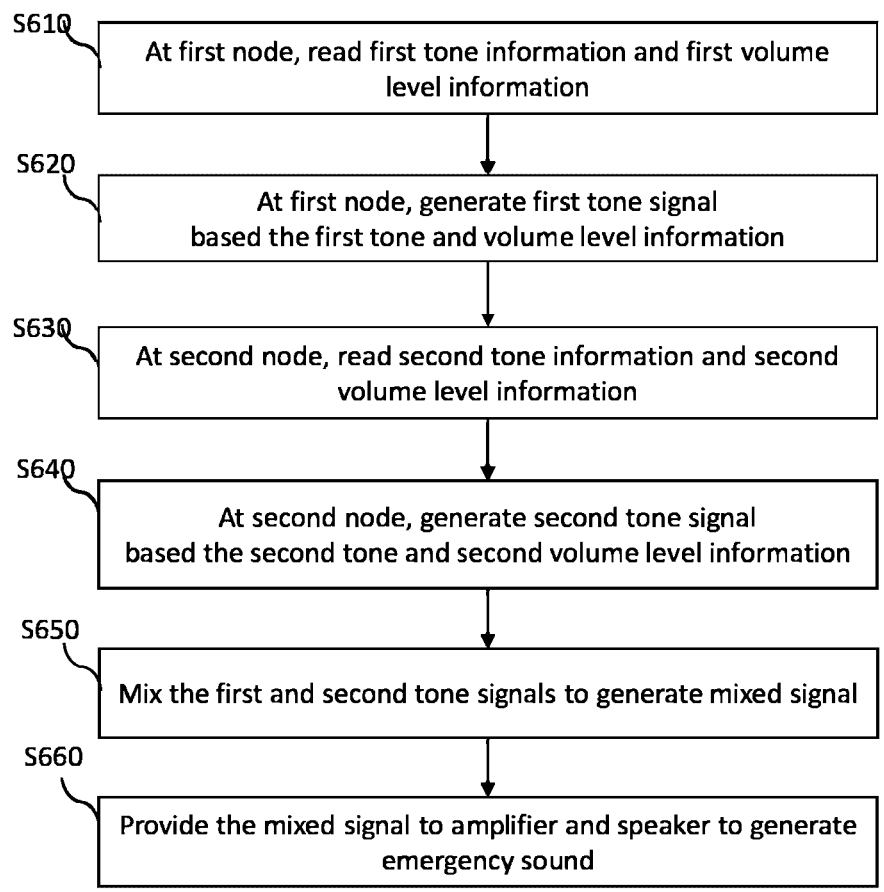
FIG. 6A is a view illustrating a method for an emergency sound output according to an embodiment of the present disclosure.
Figure 6B:
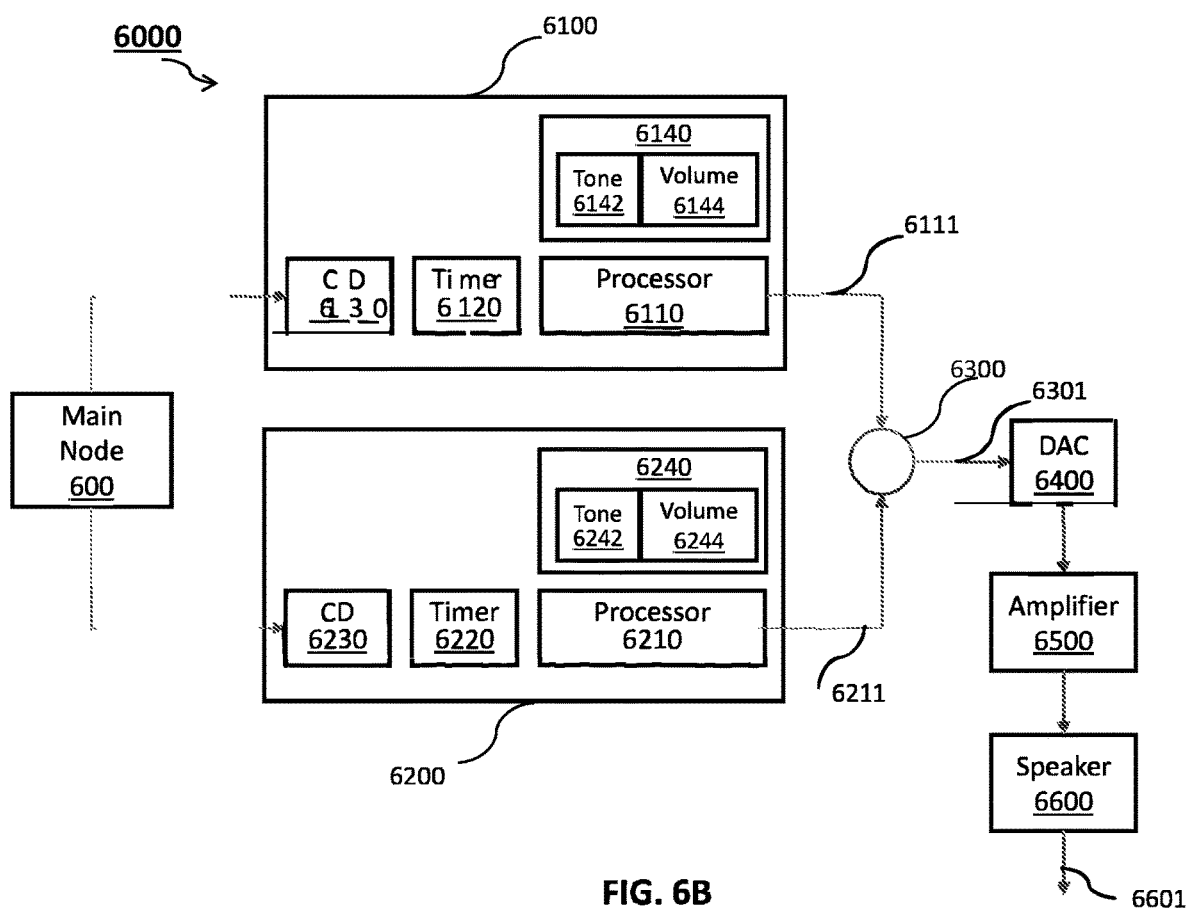
FIG. 6B is a block diagram illustrating an example system associated with the method of FIG. 6A according to an embodiment of the present disclosure.

In this section, a method or system for synchronizing multiple sirens based on globally synchronizing the sirens in time. As an example, referring to FIG. 6A, illustrated is a method for synchronizing two nodes 6100 and 6200 and synthesizing a desired sound whose frequency and volume level compliant to preset requirements or serving to make the sound more noticeable to other drivers. In the present disclosure, the term synchronizing nodes (or sirens) may be understood as "synchronizing tones respectively output from the nodes (or sirens)". FIG. 6B is a block diagram illustrating a system 6000 associated with the method of FIG. 6A.

Referring now to FIG. 6B, the first node 6100 includes a processor 6110, a memory 6140 coupled to the processor 6110, a communication device 6130, and a timer 6120. Further, the second node 6200 includes a processor 6210, a memory 6240 coupled to the processor 6210, a communication device 6230, and a timer 6220.

While it is illustrated in FIG. 6B that each node has its own processor and memory for the sake of description, embodiments of the present disclosure are not limited thereto. For example, there may be a processor (not shown) and a memory (not shown), each of which is shared to control or perform processing jobs associated with each of the nodes 6100 and 6200. For example, operations of each node of FIG. 6B are approximately the same as the node 10a of FIG. 2B except that they are required to a time synchronization therebetween to make a final output sound synchronized in tone. Thus, duplicate description thereof will be omitted for the sake of simplicity.

Referring now to FIG. 6A, the processor 6110 of the first node 6100 reads tone information 6142 and the volume level information 6144 from the memory 6140 (S610). The tone information 6142 and the volume level information 6144 both correspond to the first node 6100 (e.g., particularly a siren associated with the first node 6100). Further, the processor 6110 generates a first tone signal 6111 based on the tone information 6142 and the volume level information 6144 (S620).

Referring still to FIG. 6A, the processor 6210 of the second node 6200 reads tone information 6242 and volume level information 6244 from the memory 6240 (S630). The tone information 6242 and the volume level information 6244 both correspond to the second node 6200 (e.g., particularly a siren associated with the second node 6200). Further, the processor 6210 generates a second tone signal 6211 based on the tone information 6242 and the volume level information 6244 (S640).

Referring still to FIG. 6A, in step S650, the two tone signals 6111 and 6211 are mixed to generate a mixed tone signal 6301 using, but not limited to, a firmware implementation of a signal mixer 6300. The mixed tone signal 6301 is a basis for generating an emergency sound 6601 which is compliant to preset requirements and noticeable to other drivers. When the tone signals 6111 and 6211 are mixed, a phase offset φ therebetween is an important factor in order to control aspects of a final output sound being generated from each node based on, e.g., they are in (e.g., φ=0) or output of phase (e.g., φ=π). In the present disclosure, "mixing tone signals" may be understood as "adding, superimposing, or multiplying the tone signals". Thus, for the precise control of the phase offset gyp, each of the nodes 6100 and 6200 is required to timely synchronized to a global time of a reference node (e.g., main node 600) which will be obtained by a method explained below.

In addition, in step S660, the mixed tone signal 6301 is provided to a DAC 6400, an amplifier 6500 and a speaker 660 for generating the emergency sound 6601. The global time being acquired can be used to synchronize tones as well as their corresponding variable volume levels defined in the mapping table 300 of FIG. 3.

By way of example only, using the modulo of a tone time (e.g., predetermined period Tp) with the global time stamp, a corresponding frequency and an associated volume level that should be played through a speaker (e.g., 6600 of FIG. 6B) can be found. In addition, the output volume level of each node (or siren) can be scaled based on the volume level determined based on the mapping table 300 of FIG. 3, so that a dynamic volume level scaling over the course of a tone time (e.g., the scaling can be made for a predetermined time tone) can be achieved when tone signals are mixed (or multiplied). For example, dynamically scaled multiple tones are mixed together in phase by having the voltage at each time multiplied by 1/NumberOfTones. This allows for sounding to other drivers as if there are multiple vehicles approaching from distances away. Further, for example, the mixed tone signal (e.g., 6301 of FIG. 6B) can be scaled globally by taking the resulting voltage level found after all the mixing and dynamic scaling of the respective tone signals (e.g., 6111 and 6211 of FIG. 6B) and by mapping the resulting voltage level to a digital signal (e.g., defined by a byte from 0 to 255) that corresponds to a percentage of the peak volume level of unscaled mixed tone signal. The scaled mixed tone signal can be output to the DAC 6400, the amplifier 6500, and the speaker 6600 which are sequentially arranged. This allows the system to set the output volume level of an emergency sound to be compliant to preset volume level requirements defined in associated regulation specifications and to change the volume level between the specifications.

Further, by way of example only, the resulting volume level can be provided over the CAN bus and can be a value upon which the resultant mixed tone signal is based. If a tone is created on the fly, a timing associated with the created tone cannot be known until it has been created. Therefore, after it is created, the time of the on the fly tone may be substituted and scaled using the volume intensity list. Also, the entirety of the resultant tone signal may be scaled after it has been mixed and/or dynamically scaled over the period of time without using a volume intensity list.

Referring still to FIG. 6A, prior to the steps S610 to S660, the nodes 6100 and 6200 each performs a time synch to a global time tg based on a couple of synch messages transmitted from a main node 600. The main node 600 is in communication with each of the nodes via a CAN bus network.

Figure 5:
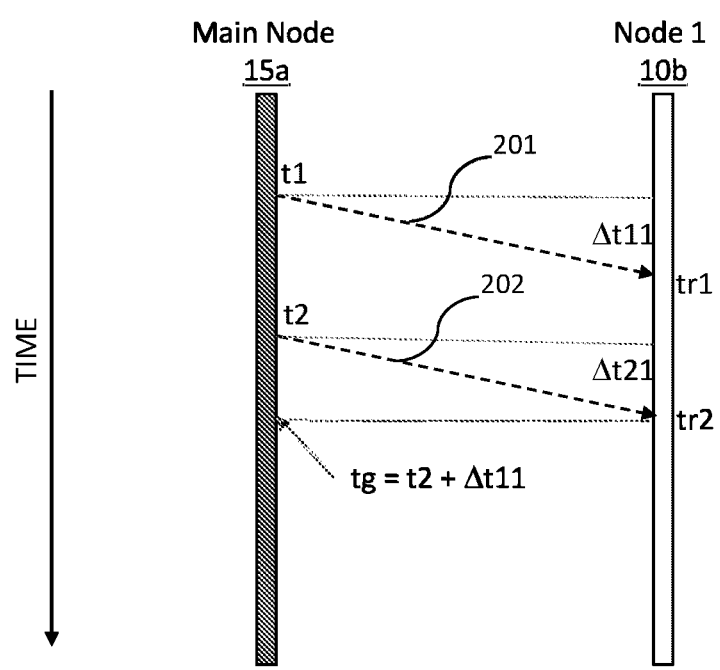
FIG. 5 is a view illustrating an example algorithm to be performed by each node to synchronize its local time to a global time of a main node according to an embodiment of the present disclosure.

FIG. 5 is a view illustrating an example algorithm to be performed by each node to synchronize its local time to a global time tg of a main node 15a according to an embodiment of the present disclosure.

Referring to FIG. 5, the main node 15a transmits a first synch message 201 to a certain node 10b (e.g., node 6100 or 6200) for the time synch between the nodes. The main node 15a transmits a first synch message 201 at t1.

Then, the node 10b receives the first synch message 201 using a communication device (e.g., 6130) and acquires a first receive time tr1 upon receipt of the first synch message 2 using a timer (e.g., 6120). The time difference Δt11 may be understood as a propagation time over a channel between the node 10b and the main node 15a. Next a second message is sent tr2 containing the transmit complete time of t1 based on the master's internal clock and a processor determines a time difference delta t11 between this transmit complete time and the first received time tr1 of the slave. The node 10b then determines a global time tg by adding the time difference Δt11 its current internal time. For instance, the node 10b may replace the second receive time tr2 by t_local+Δt11 (e.g., tg=t_local+Δt11).

The aforementioned time synchronization method can be applied to each of the nodes 6100 and 6200, so that the local time of each node will be synchronized to the global time tg of the main node. Once each node is set to be synchronized to the global time tg, the global time may not be modified by other emergency signaling units such as light bars using the aforementioned method. For example, the frequency or intensity variations of light bars may be based on the synchronized global time. The time synchronization using the global time allows the system to instantaneous jump in frequency and volume level of a mixed tone (analog) signal or square wave 6301 (e.g., square-wave) being played through the amplifier (e.g., 6500) to resync the tone globally to other sirens playing that same pattern in the same phase, this can allow light patterns of the same length to sync to flash patterns making them more noticeable to the human eye.

Alternatively, a reload time of the internal timer (e.g., 80-microsecond timer) of the siren node (e.g., 600) can be reduced to allow that siren to catch up to and track the global time of the main node. For example, if each node is behind the global time of the main node by a predetermined time (e.g., a few milliseconds box), the reload time of the timer of that node can be reduced for the node to catch itself up smoothly by running the threads in the real-time operating system (RTOS) more often. Further, this can further be enhanced using a proportional—integral—derivative (PID) controller to catch up more quickly or slowly based on whether a local time of the node is far or close to the global time accordingly.

Referring back to FIGS. 5 and 6B, in one embodiment, the transmit times t1 and t2 included in the respective synch messages 201 and 202 can be obtained using the internal timer of the main node (e.g., 600) based on the length of time that has elapsed since the system has powered up. In another embodiment, the transmit times t1 and t2 can be obtained from a node containing a global positioning system (GPS) module which tracks and relays a GPS Time which began counting on midnight between Jan. 5, 1980 and Jan. 6, 2019, which is the same on any GPS module allowing nodes (or sirens) between any of two or more systems (e.g., Whelen products) to be synchronized globally.

In one embodiment, once a global time is synchronized and tracked at all the nodes. A time into the tone $t_{int}$ can be determined by the following equation (1):

$$t_{int} = (\text{degreeOfPhase}/360 \times \text{timeOfTone}) + (\text{currentGobalAbsoluteTime Mod timeOfTone}) \quad \text{Equation (1)},$$

where the time into the tone $t_{int}$ is where a tone should be currently positioned in the tone cycle that simulates its repetitive pattern since the main box booted up. The degreeOfPhase represents a phase in degree where the playback of the tone would have been, at a global time zero. The currentGlobalAbsoluteTime represents a current global time. The "Mod" represent a modulo operator. The timeOfTone is a time period where a tone period exists. For example, if the tone is being played at degreeOfPhase of 0, at the global time zero, the tone will start at the beginning at this point in time. Further, if the tone is being playing at degreeOfPhase 180, the tone would start halfway through its period at global time zero. Therefore, any tones or patterns with this as their period (e.g., timeOfTone) will be synchronized with one another because they are based on the same global time (e.g., zero) and the same repeating periodic time base to figure out where they are into the pattern.

Figure 4C:
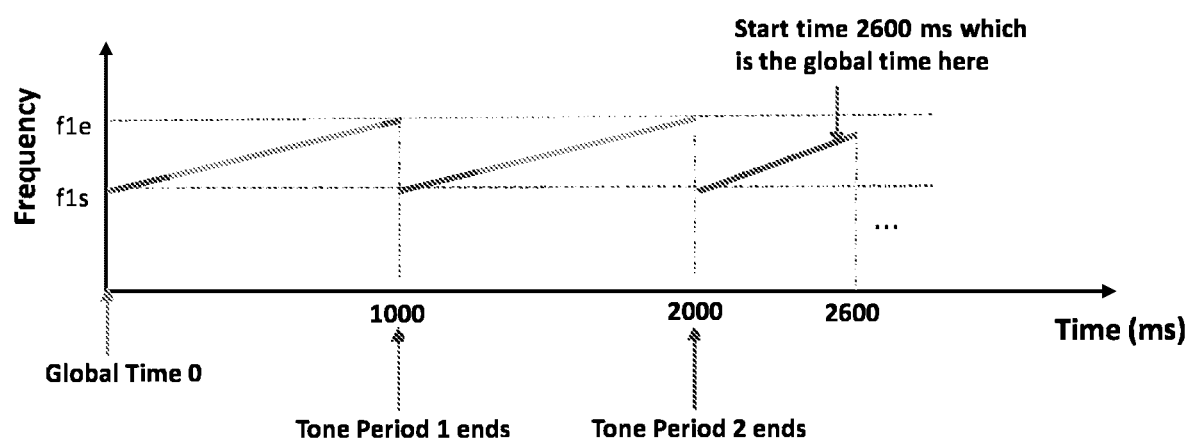
FIG. 4C is a view illustrating an example timing diagram for determining a time into tone according to an embodiment of the present disclosure.

FIG. 4C is a view illustrating an example timing diagram for determining a time into tone $t_{int}$ according to an embodiment of the present disclosure. For example, referring to FIG. 4C, the tone period (e.g., timeOfTone) repeats for every 1000 ms, the tone is played at degreeOfPhase of 0, at the global time zero, and the global time is 2600 ms.

Asynchronous Mode Tone Synchronization

In this section, an example method or system for synchronizing multiple sirens in an asynchronous mode are described with reference to FIGS. 7A and 7B. For example, in case nodes 7100 and 7200 of FIG. 7A cannot be synchronized using the method on the global time stamping, as described with reference to FIGS. 5, 6A and 6B of the previous section, a tone signal 7111 output from one node 7100 may be output to an aux input of another node 7200, which allows the nodes 7100 and 7200 to quickly change between tones being generated locally on the respective nodes. In addition, the node 7200 receiving the tone signal 7111 through an aux input from the node 7100 may be configured to selectively output the tone signal to the amplifier 7220 and the speaker 7230 sequentially arranged.

Figure 7A:
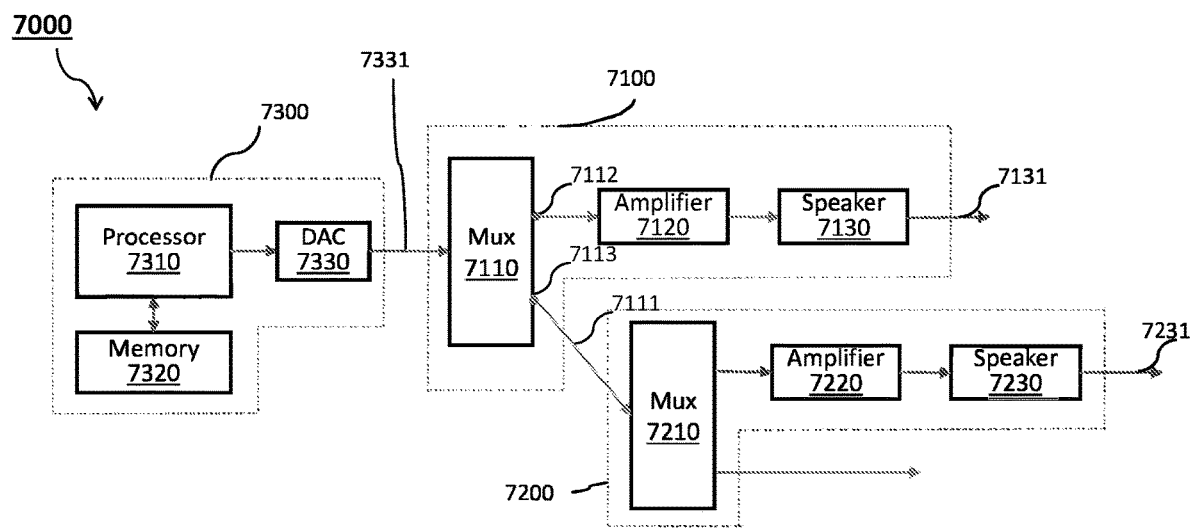
FIG. 7A is a block diagram illustrating an example system associated with a method of FIG. 7B according to an embodiment of the present disclosure.
Figure 7B:
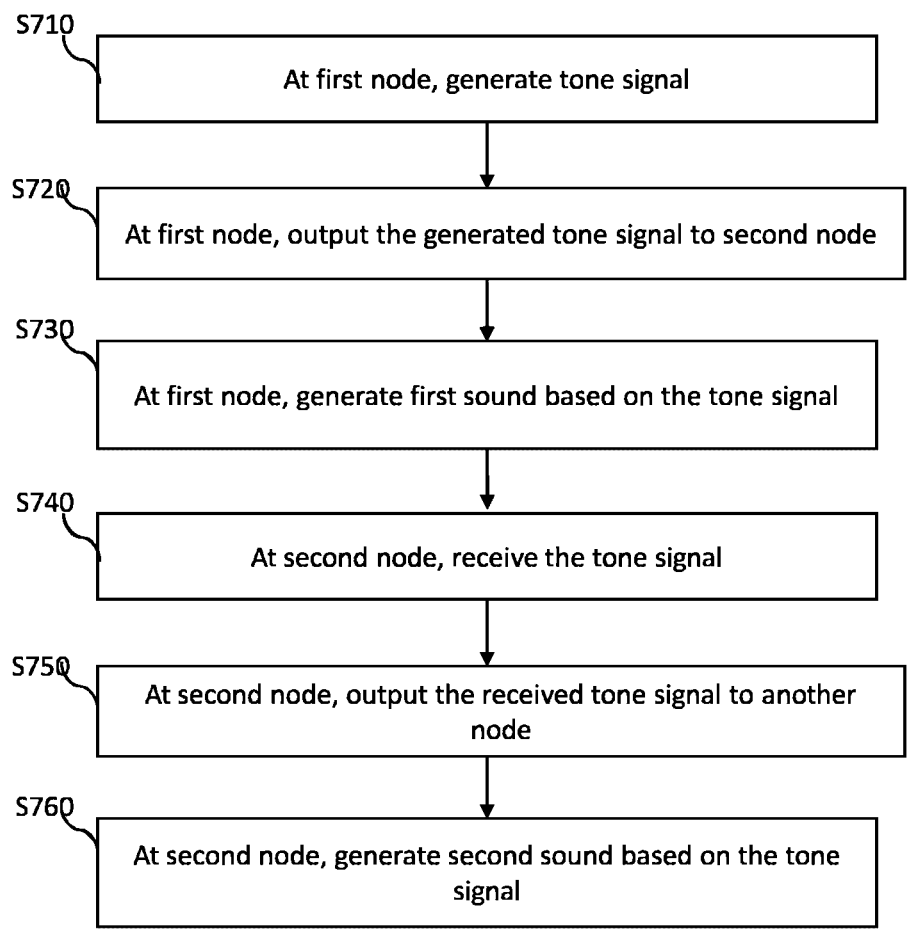
FIG. 7B is a view illustrating a method for an emergency sound output according to an embodiment of the present disclosure.

Referring to FIGS. 7A and 7B, the synchronization system 7000 can be described in associated with a processor 7310, a memory 7320 coupled to the processor 7310, a DAC 7330, a first node 7100 including a first mux 7110, an amplifier 7120 and a speaker 7130, and a second node 7200 including a second mux 7210, an amplifier 7220, and a speaker 7230.

In step S710, the first node 7100 generates a tone signal 7111 having a single tone or mixed multiple tones using the processor 7310. Similar to what is described with reference to FIG. 2B, the processor 7310 reads tone information and volume level information both corresponding to the first node 7100 and provides a digital tone signal to the DAC 7330 which converts the digital tone signal to an analog tone signal 7331. The output analog tone signal 7331 of the DAC 7330 is provided to the first mux 7110. For example, the analog tone signal 7331 provided by the DAC 7330 can be a sine wave and a square wave depending on, e.g., whether the analog tone signal consists of a single tone or multiple tones. In one embodiment, the first mux 7110 may be an electric switch and may be configured to selectively output one of the sine wave or the square wave to an aux output thereof. For the sake of simplicity, the sine wave and the square wave are collectively referred to a (analog) tone signal (e.g., 7331).

In addition, the first mux 7110 also provides the tone signal 7111 to the amplifier 7120 and the speaker 7130 sequentially arranged through a regular port 7112 and to the second mux 7210 through an aux port 7113 (S720).

Further, in step S740, the second mux 7210 receives the tone signal 7111 from the first mux 7110 and provides the received tone signal 7111 to the amplifier 7220 and the speaker 7230 sequentially arranged through a regular port and to an input port of another node (not shown) which will be synchronized to the nodes 7100 and 7200.

In the first node 7100, the tone signal 7111 outputted through the regular port 7112 can be a basis for generating an emergency sound 7131 using the amplifier 7120 and the speaker 7130 (S730). Similarly, in the second node 7200, the tone signal 7111 outputted through the regular port can be a basis for generating an emergency sound 7231 using the amplifier 7220 and the speaker 7230 (S760). It is noted that the emergency sounds 7131 and 7231 are synchronized in time (or phase) and/or tone.

Although it is illustrated and described with reference to FIG. 7A, the first node 7100 includes the first mux 7110, the amplifier 7120, and the speaker 7130; the second node 7200 includes the second mux 7210, the amplifier 7220, and the speaker 7230; and the processing part 7300 including the processor 7310, the memory 7320, and the DAC 7330 is separated from each of the nodes 7100 and 7200. However, these configurations are only examples for the sake of description, and thus embodiments of the present disclosure are not limited thereto. For example, the processing part 7300 can be part of the first node 7100. Still, for example, the amplifiers 7120 and 7220 (or the speakers 7130 and 7230) may be implemented with a single amplifier (or a single speaker) which can be shared by the first and second nodes 7100 and 7200.

The asynchronous mode synchronization method described in this section may particularly be useful when tones (or tone signals) generated by respective nodes cannot be synchronized, at least because the tones do not have a constant or know length at an amplifier or a tone does a message in the beginning once and then repeats the second half of the tone exclusively. These tones can be synchronized between nodes by using an auxiliary output from one node (e.g., 7100 of FIG. 7A) to an auxiliary input of a next node (e.g., 7200 of FIG. 7A) and stringing them together. The auxiliary output can then be selected and played on each node individually resulting in the same tone with no phase offset therebetween or only a slight phase shift due to capacitance in the hardware.

Regarding the processors 110 of FIG. 2B, 6110 and 6210 of FIG. 6B, and 7310 of FIG. 7A, at least one of the processors can be implemented with an m4 microcontroller which allows for floating point calculations. Further, a real-time operating system (RTOS) can be used to allocate computing times to the proper process in a node in a timely manner.

Regarding the amplifiers 130 of FIG. 2B, 6500 of FIG. 6B, and 7120 and 7220 of FIG. 7A, at least one of the amplifiers can be implemented with a class-D amplifier to vary the volume level of a tone signal. This may allow for the amplifier to be made that is much more power efficient instead of dissipating much power in the form of heat over the output transistors. This would eliminate the need for a transformer as well which would bring costs down significantly.

It is because class AB amplifiers may be inefficient particularly when they work with an input analog tone signal, substantial amount of output power from each class-AB amplifier may be dropped over the output transistors in the form of heat.

In one embodiment, the aforementioned global synchronization can be used for noise cancellation when it is combined with the ability to shift the phase in our sine wave lookup table that is a basis for finding an appropriate frequency and volume level values. For example, if an amplifier outputs a sine wave of an 1 kHz frequency having a phase of 0 degree, a cabin speaker can output a sine wave of the same frequency having a phase of 180 degrees, so the sine wave output from the amplifier can be canceled out due to the sine wave output from the cabin speaker. Example embodiments regarding the noise cancellation in a vehicle are disclosed in Applicant's copending U.S. patent application Ser. No. 16/295,236, filed on Mar. 7, 2019, entitled "SYSTEM AND METHOD FOR NOISE CANCELLATION IN EMERGENCY RESPONSE VEHICLES", the entire disclosure of which is incorporated by reference herein.

Figure 8:
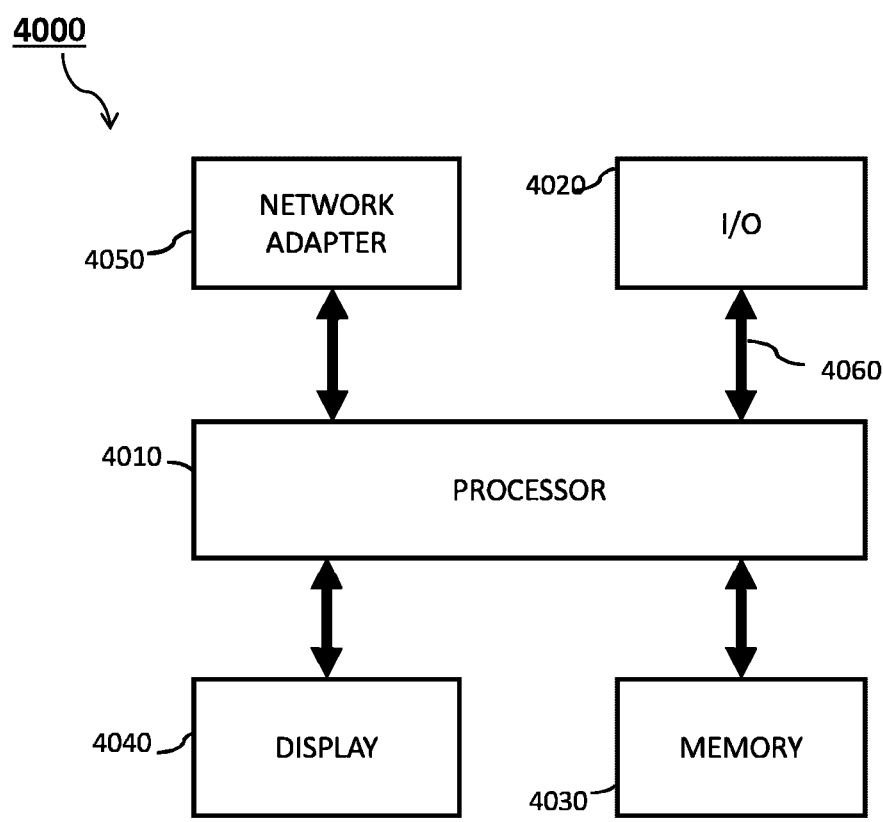
FIG. 8 is a block diagram of a computing system according to an embodiment of the present disclosure.

FIG. 8 is a block diagram of a computing system 4000 according to an exemplary embodiment of the present disclosure.

Referring to FIG. 8, the computing system 4000 may be used as a platform for performing: the functions or operations described hereinabove with respect to at least one of the systems 10a of FIG. 2B, 6000 of FIG. 6B and 7000 of FIG. 7A and/or the method described with reference to FIGS. 2A, 6A and 7B.

Referring to FIG. 8, the computing system 4000 may include a processor 4010, I/O devices 4020, a memory system 4030, a display device 4040, and/or a network adaptor 4050.

The processor 4010 may drive the I/O devices 4020, the memory system 4030, the display device 4040, and/or the network adaptor 4050 through a bus 4060.

The computing system 4000 may include a program module for performing: the functions or operations described hereinabove with respect to at least one of the systems 10a of FIG. 2B, 6000 of FIG. 6B and 7000 of FIG. 7A and/or the method described with reference to FIGS. 2A, 6A and 7B. For example, the program module may include routines, programs, objects, components, logic, data structures, or the like, for performing particular tasks or implement particular abstract data types. The processor (e.g., 4010) of the computing system 4000 may execute instructions written in the program module to perform: the functions or operations described hereinabove with respect to at least one of the systems 10a of FIG. 2B, 6000 of FIG. 6B and 7000 of FIG. 7A and/or the method described with reference to FIGS. 2A, 6A and 7B. The program module may be programmed into the integrated circuits of the processor (e.g., 4010). In an exemplary embodiment, the program module may be stored in the memory system (e.g., 4030) or in a remote computer system storage media.

The computing system 4000 may include a variety of computing system readable media. Such media may be any available media that is accessible by the computer system (e.g., 4000), and it may include both volatile and non-volatile media, removable and non-removable media.

The memory system (e.g., 4030) can include computer system readable media in the form of volatile memory, such as RAM and/or cache memory or others. The computer system (e.g., 4000) may further include other removable/non-removable, volatile/non-volatile computer system storage media.

The computer system (e.g., 4000) may communicate with one or more devices using the network adapter (e.g., 4050). The network adapter may support wired communications based on Internet, local area network (LAN), wide area network (WAN), or the like, or wireless communications based on code division multiple access (CDMA), global system for mobile communication (GSM), wideband CDMA, CDMA-2000, time division multiple access (TDMA), long term evolution (LTE), wireless LAN, Bluetooth, Zig Bee, or the like.

Figure 9:
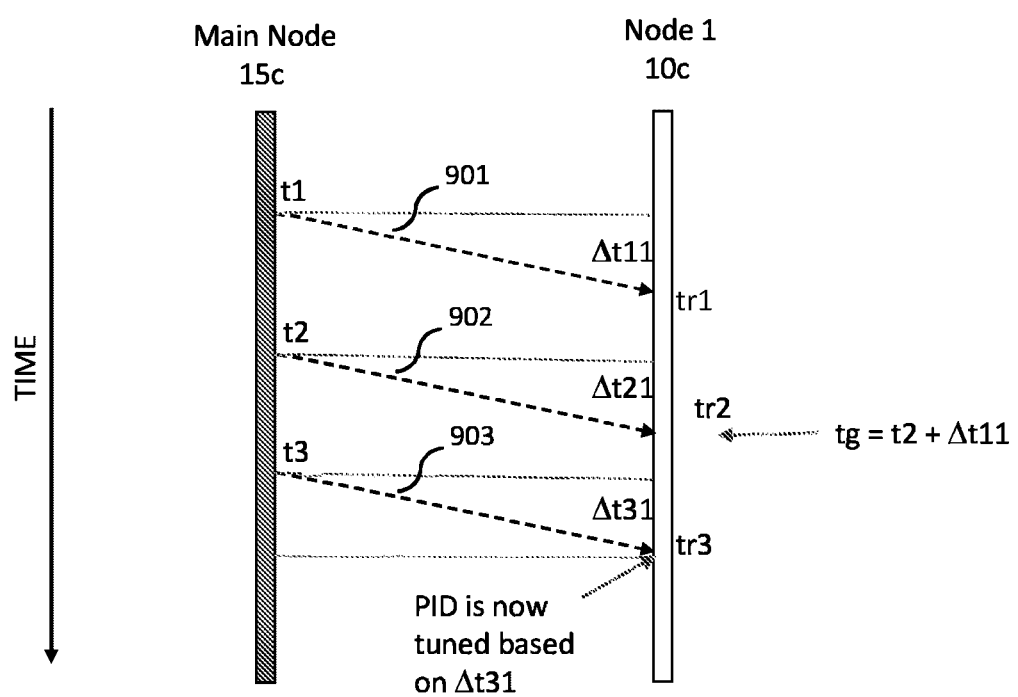
FIG. 9 is a view illustrating an example algorithm to be performed for synchronization for sirens to prevent audible jumps in tones according to another embodiment of the present disclosure.

FIG. 9 is a view illustrating an example algorithm to be performed for synchronization according to another embodiment of the present disclosure. This embodiment is preferred for sirens to prevent audible jumps in tones, but is also applicable to other components requiring synchronization, e.g., lights.

When syncing using a PID controller as opposed to just instantaneously jumping to a new timestamp using the method already specified above, three consecutive sync messages 901-903 are required as opposed to two (see FIG. 5). This is due to the need for the PID controller to be tuned before use allowing for the same PID controller with different numbers to be used across varying temperature ranges and varying drifts between the main and external node. The first two synch messages and the processes performed are the same as those described in FIG. 5. That is, the global time tg is calculated using two synch messages 901 and 902, i.e., tg=t2+Δt11.

Once this difference is added to the internal clock in node 10c and the two devices (15c and 10c) are in theory perfectly synced for that instance in time, slow drift is still occurring from the main node 15c based on the difference in running rates between the oscillators on the two nodes (15c and 10c). To prevent the need for further jumps, which is more perceptible in a siren jump, this variance in running rates must be eliminated which is where the PID controller is utilized.

One more message is therefore needed in order to see the difference of how far the slave node was from the main node in time initially as compared to how far it is from the main nodes clock one sync message later. The main node 15c transmits a third synch message 903 to node 10c (e.g., node 6100 or 6200). The main node 15c transmits the third synch message 903 which includes the second transmit complete message tr2. The third synch message 903 is received at node 10c and the receive time tr3 is recorded.

For example, if the time difference was initially 50 ms and it is now 55 ms one sync message later, this indicates that drift is occurring at a rate of 5 ms. The PID controller is not necessarily meant to eliminate the 5 ms difference, but adjust for the continuous 5 ms drift which is occurring after the jump. Thus, the P, I, and D values can be tuned based on a percentage of this drift to slow down or speed up the clock in node 10c to bring the devices into synchronization without an abrupt jump. In addition, a maximum allowable drift can be preset, which, if exceed, will trigger the need for a new jump and thereafter a new tuning will be needed in order to allow the PID controller the ability to compensate for the new drift, which is often caused by temperature variations or some other external factor. The PID controller and the values used for tuning can then be used to alter the auto reload register time of that clock in node 10c as to what constitutes 1 ms for instance and speed it up or slow it down so that its 1 ms now happens at a slightly different rate as measured by external devices; but, the internal tasks to node 10c still treat this time as if 1 ms has occurred slowing down or speeding up there tasks in real time to compensate.

A method for synchronizing a local node to a global time, comprising: receiving, using one or more processors, a first time at which a main node transmits a first synch message including the first time; determining, using the one or more processors, a second time at which the local node receives the first synch message; determining, using the one or more processors, a difference between the first time and the second time; receiving, using one or more processors, a third time at which the main node transmits a second synch message including the third time; determine, using the one or more processors, a fourth time at which the local node receives the second synch message; and determine, using the one or more processors, the global time by adding the first difference to the third time.

Further comprising receiving, using one or more processors, a fifth time at which the main node transmits a third synch message; determine, using the one or more processors, a sixth time at which the local node receives the third synch message; determining, using the one or more processors, a difference between the fifth time and the sixth time; adjusting the values of a proportional—integral—derivative (PID) controller based on a percentage of the difference between the fifth time and the sixth time; and adjusting a clock of a controlled device based on the adjusted values of the PID controller.

Further comprising determining if the adjusting of the values exceeds a preset limit; and if the adjusting of the values exceeds the preset limit, resetting the global time.

Exemplary embodiments of the present disclosure may include a system, a method, and/or a non-transitory computer readable storage medium. The non-transitory computer readable storage medium (e.g., the memory system 4030) has computer readable program instructions thereon for causing a processor to carry out aspects of the present disclosure.

The computer readable storage medium can be a tangible device that can retain and store instructions for use by an instruction execution device. The computer readable storage medium may be, for example, but not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EEPROM or Flash memory), a static random access memory (SRAM), a portable compact disc read-only memory (CD-ROM), a digital versatile disk (DVD), a memory stick, a floppy disk, or the like, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to the computing system 4000 from the computer readable storage medium or to an external computer or external storage device via a network. The network may include copper transmission cables, optical transmission fibers, wireless transmission, routers, firewalls, switches, gateway computers and/or edge servers. A network adapter card (e.g., 4050) or network interface in each computing/processing device receives computer readable program instructions from the network and forwards the computer readable program instructions for storage in a computer readable storage medium within the computing system.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the computing system (e.g., 4000) through any type of network, including a LAN or a WAN, or the connection may be made to an external computer (for example, through the Internet using an Internet Service Provider). In an exemplary embodiment, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, system (or device), and computer program products (or computer readable medium). It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The corresponding structures, materials, acts, and equivalents of all means or step plus function elements, if any, in the claims below are intended to include any structure, material, or act for performing the function in combination with other claimed elements as specifically claimed. The description of the present disclosure has been presented for purposes of illustration and description but is not intended to be exhaustive or limited to the present disclosure in the form disclosed. Many modifications and variations will be apparent to those of ordinary skill in the art without departing from the scope and spirit of the present disclosure. The embodiment was chosen and described in order to best explain the principles of the present disclosure and the practical application, and to enable others of ordinary skill in the art to understand the present disclosure for various embodiments with various modifications as are suited to the particular use contemplated.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated but fall within the scope of the appended claims.

What is claimed is:

1. A system for synchronizing a local node to a global time, comprising:
   one or more processors, configured to:
      receive a first time at which a main node transmits a first synch message including the first time;
      determine a second time at which the local node receives the first synch message;
      determine a difference between the first time and the second time;
      receive a third time at which the main node transmits a second synch message including the third time;
      determine a fourth time at which the local node receives the second synch message; and
      determine the global time by adding the first difference to the third time.

2. The system of claim 1, wherein the main node transmits the first and second synch messages over a controller area network.

3. The system of claim 1, wherein the main node comprises a main timer configured to determine the first time based on a length of time that has elapsed after the main node has powered up.

4. The system of claim 1, wherein the one or more processors are further configured to determine the first time based on a global positioning system.

5. The system of claim 1, wherein to increase a synchronization speed of each of the first and second nodes, the one or more processors are further configured to reduce a reload time of the main timer.

6. A method for synchronizing a local node to a global time, comprising:
   receiving, using one or more processors, a first time at which a main node transmits a first synch message including the first time;
   determining, using the one or more processors, a second time at which the local node receives the first synch message;
   determining, using the one or more processors, a difference between the first time and the second time;
   receiving, using one or more processors, a third time at which the main node transmits a second synch message including the third time;
   determine, using the one or more processors, a fourth time at which the local node receives the second synch message; and
   determine, using the one or more processors, the global time by adding the first difference to the third time.

7. The method for synchronizing a local node to a global time of claim 6, further comprising:
   receiving, using one or more processors, a fifth time at which the main node transmits a third synch message;
   determine, using the one or more processors, a sixth time at which the local node receives the third synch message;
   determining, using the one or more processors, a difference between the fifth time and the sixth time;
   adjusting the values of a proportional-integral-derivative (PID) controller based on a percentage of the difference between the fifth time and the sixth time; and
   adjusting a clock of a controlled device based on the adjusted values of the PID controller.

8. The method for synchronizing a local node to a global time of claim 7, further comprising:

determining if the adjusting of the values exceeds a preset limit; and if the adjusting of the values exceeds the preset limit, resetting the global time.

* * * * *